United States Patent
Lacrampe et al.

(10) Patent No.: US 9,608,153 B2
(45) Date of Patent: Mar. 28, 2017

(54) MULTILAYER WHITE POLYESTER FILM METHOD FOR MANUFACTURING SAID FILM AND USE OF THIS FILM AS PART OF A BACK SHEET FOR PHOTOVOLTAIC CELLS

(71) Applicant: TORAY FILMS EUROPE, Saint-Maurice-de-Beynost (FR)

(72) Inventors: Valerie Lacrampe, Saint-Maurice-de-Beynost (FR); Karine Billard, Saint-Maurice-de-Beynost (FR); Timothy Stevenson, Saint-Maurice-de-Beynost (FR); Naoki Kawaji, Saint-Maurice-de-Beynost (FR); Hideki Fujii, Saint-Maurice-de-Beynost (FR); Julien Faldysta, Saint-Maurice-de-Beynost (FR)

(73) Assignee: TORAY FILMS EUROPE, Saint-Maurice-de-Beynost (FR)

( * ) Notice: Subject to any disclaimer, the term of this patent is extended or adjusted under 35 U.S.C. 154(b) by 700 days.

(21) Appl. No.: 13/942,198

(22) Filed: Jul. 15, 2013

(65) Prior Publication Data

US 2014/0020749 A1   Jan. 23, 2014

Related U.S. Application Data

(63) Continuation-in-part of application No. PCT/IB2011/000470, filed on Jan. 31, 2011.

(51) Int. Cl.
  *B32B 27/20* (2006.01)
  *B32B 27/36* (2006.01)
  (Continued)

(52) U.S. Cl.
  CPC ........ *H01L 31/0487* (2013.01); *B29C 55/023* (2013.01); *B32B 27/20* (2013.01);
  (Continued)

(58) Field of Classification Search
  CPC . B32B 27/36; B32B 2307/41; B32B 2309/02; B32B 2309/105; B32B 27/20;
  (Continued)

(56) References Cited

U.S. PATENT DOCUMENTS

| 4,041,206 A | 8/1977 | Tsunashima et al. |
| 6,593,406 B2 | 7/2003 | Sargeant et al. |

(Continued)

FOREIGN PATENT DOCUMENTS

| EP | 0 408 042 | 1/1991 |
| EP | 0 515 096 | 11/1992 |

(Continued)

OTHER PUBLICATIONS

W.J. Gambogi, Comparative Performance on Backsheets for Photovoltaic Modules, In: 25th European Photovoltaic Solar Energy Conference and Exhibition / 5th World Conference on Photovoltaic Energy Conversion (2010) Valencia, Spain, ISBN: 3-936338-26-4, p. 4079-4083.

(Continued)

*Primary Examiner* — Jayne Mershon
*Assistant Examiner* — Mayla Gonzalez Ramos
(74) *Attorney, Agent, or Firm* — Vedder Price P.C.; Thomas J. Kowalski; Deborah L. Lu (57) ABSTRACT

The invention concerns a multilayer biaxially oriented white polyester film (adhesion, absence of chalking, opacity whiteness, reflectance, hydrolysis resistance & light stability) comprising three polyester layers: a core layer and two outer layers and contains TiO$_2$ particles. In this film: at least one layer comprises a PET whose: number average molecular (Continued)

weight is within [18500-40000]; intrinsic viscosity IV is ≥0.70 dL/g; and carboxyl group content is ≤30 eq/T. Additionally, the core layer comprises $TiO_2$ particles in a range of [0.1-40]% w/w; the intrinsic viscosity IV is between [0.5-0.85] dL/g; a small endothermic peak temperature is between 180-230° C.; and at least one light stabilizer is added in at least one of the outer layers, in a total concentration between [0.1-35]% w/w. The invention also includes the method for manufacturing such film and the laminate which is part of the back sheet of a solar cell.

13 Claims, 2 Drawing Sheets (51) Int. Cl.
   B32B 38/00      (2006.01)
   B29C 55/02      (2006.01)
   B29C 55/14      (2006.01)
   B29K 67/00      (2006.01)
   H01L 31/048     (2014.01)
   H01L 31/049     (2014.01)
   H01L 31/0232    (2014.01)
   B32B 37/15      (2006.01)

(52) U.S. Cl.
   CPC .......... B32B 27/36 (2013.01); B32B 38/0012 (2013.01); B32B 38/0036 (2013.01); H01L 31/02327 (2013.01); H01L 31/048 (2013.01); H01L 31/049 (2014.12); H01L 31/0481 (2013.01); B29C 55/143 (2013.01); B29K 2067/003 (2013.01); B32B 37/153 (2013.01); B32B 38/0008 (2013.01); B32B 2307/41 (2013.01); B32B 2309/02 (2013.01); B32B 2309/105 (2013.01); B32B 2457/12 (2013.01); Y02B 10/12 (2013.01); Y02E 10/50 (2013.01); Y10T 428/24942 (2015.01); Y10T 428/31786 (2015.04)

(58) Field of Classification Search
   CPC ............ B32B 2457/12; B32B 38/0008; B32B 38/0012; B32B 38/0036; H01L 31/048; H01L 31/0481; H01L 31/049; H01L 31/02327; H01L 31/0487; Y02E 10/50; B29K 2067/003; B29C 55/023; B29C 55/143; Y02B 10/12; Y10T 428/24942; Y10T 428/31786
   See application file for complete search history.

(56) References Cited

U.S. PATENT DOCUMENTS

| | | | |
|---|---|---|---|
| 6,855,758 B2 | 2/2005 | Murschall et al. | |
| 7,241,507 B2 | 7/2007 | Kliesch et al. | |
| 2004/0151877 A1* | 8/2004 | Suh | B32B 27/36 428/141 |
| 2009/0065055 A1* | 3/2009 | Fujii | B32B 27/20 136/259 |
| 2010/0292375 A1* | 11/2010 | Kliesch | B32B 27/36 524/114 |
| 2013/0012665 A1* | 1/2013 | Nozawa | C08G 63/85 525/437 |

FOREIGN PATENT DOCUMENTS

| | | | |
|---|---|---|---|
| EP | 1 995 789 | 11/2008 | |
| EP | 2 001 056 | 12/2008 | |
| EP | 2 062 938 | 5/2009 | |
| EP | 2 124 261 | 11/2009 | |
| EP | 2 221 336 | 8/2010 | |
| JP | 2009 256 621 A2 | 11/2009 | |
| JP | WO 2011087043 A1 * | 7/2011 | ............ C08G 63/85 |
| WO | WO 01/53407 | 7/2001 | |
| WO | WO 2009/083552 | 7/2009 | |
| WO | WO 2010/110119 | 9/2010 | |

OTHER PUBLICATIONS

W. Dollhopf, Measurement of Viscosity With a Capillary Viscometer, Mechanics of Fluid Systems, Ubbelohde Viscometer (Sep. 30, 2002) p. 1-2: retrieved from URL:http://vorsam.uni-ulm.de/Versuche/MF/PDF/MF020V00.pdf Retrieved Sep. 9, 2011.

* cited by examiner

MULTILAYER WHITE POLYESTER FILM METHOD FOR MANUFACTURING SAID FILM AND USE OF THIS FILM AS PART OF A BACK SHEET FOR PHOTOVOLTAIC CELLS

CROSS REFERENCE TO RELATED APPLICATIONS

This application is a continuation-in-part of International Patent Application No. PCT/IB2011/000470, filed Jan. 31, 2011, and published as WO 2012/104668.

All of the above-mentioned applications, as well as all documents cited herein and documents referenced or cited in the documents cited herein, are hereby incorporated herein in their entirety by reference.

FIELD OF THE INVENTION

The present invention relates more specifically to polyester films, in particular aromatic polyester films such as polyethylene terephthalate (PET) or polyethylene naphthalate (PEN) or polybutylene terephthalate (PBT) (preferably with biaxial orientation), which are very widely used on account of their well-known excellent properties of thermal stability, dimensional stability, chemical resistance and relatively high surface energy as protective films against a great variety of elements, for example protective films useful as back sheets for photovoltaic batteries or cells. These back sheets ensure the mechanical integrity of the photovoltaic module, protection of the solar cells and contribute to global light reflectance of the photovoltaic battery module.

The field of the invention is that of a biaxially oriented white polyester multilayer film having an excellent resistance to hydrolysis, good light stability, high opacity level and whiteness, with favourable adhesion properties and an absence of chalking or powdering phenomena after ageing.

BACKGROUND OF THE INVENTION

In recent years, solar or photovoltaic (PV) batteries composed of PV cells assembled in PV modules, have been attracting attention as the next generation of clean energy sources. Applications ranging from building to electronic have been developed. The structure of the photovoltaic battery unit is based on a composition of the following elements: a high light transmission material, photovoltaic battery module, filled resin layer and back sheet laminate. The assembled panels can be integrated on building rooftops, used in solar farms and used for electric/electronic parts. The thermoplastic resin film is used as part of the back sheet laminate of the photovoltaic battery.

With reference to the thermoplastic resin sheet (for photovoltaic batteries), the durability in the natural environment, especially regarding hydrolysis resistance, light stability and weatherability, is required.

The conventional biaxially oriented polyester polymer sheets lack in hydrolysis and UV resistance after ageing, which are the main requirements to environmental conditions resistance. They also lack in opacity which masks defects caused by lamination of back sheet.

Furthermore, the improvement in electrical transduction efficiency of sunlight within photovoltaic batteries is also required. For this purpose, the light travelling from the front side of photovoltaic battery and reflected back by the back sheet laminate of photovoltaic batteries is converted into electricity. EP2221336 presents an opaque black film which does not give a satisfying maintenance ratio of reflectivity. Moreover black films do not answer the market requirements for white back sheets. Therefore, white polyester films are also required.

The use of chain extenders for improving the hydrolysis resistance of polyethylene terephthalate films is widely described in prior art (introduction of epoxidized fatty acid glyceride is described in U.S. Pat. No. 7,241,507B2, introduction of carbodiimide or oxazoline is described in U.S. Pat. No. 6,855,758B2 and EP2062938A1, introduction of phosphate compounds is described in JP2009256621A2 for example . . . ). Nevertheless, it is well known that chain extenders are not significantly used for industrial PET films production because they have tendency to induce gel formation, filtration issue, gas formation, yellowness.

To cope with the hydrolysis resistance issue, EP-1995789-A1 provides a polyester resin sheet for photovoltaic batteries which enhances the electrical transduction efficiency of photovoltaic batteries by improving the hydrolysis and heat resistance and further enhancing the screening potential. In addition, it provides a photovoltaic battery formed by using the same from the background of the related art. This polyester resin sheet for photovoltaic batteries, comprising a polyester resin layer formed by using one or more layers having a number average molecular weight of 18500 to 40000, in which at least one or more layers having 5 to 40% by weight of titanium dioxide is formed on the polyester resin layer, wherein a light transmittance at wavelengths of 300 to 350 nm is 0.005 to 10%, a relative reflectance is 80% or more and 105% or less, an apparent density is 1.37 to 1.65 g/cm$^3$. In this polyester resin sheet for photovoltaic batteries, the thickness of the layer having 5 to 40% by weight of titanium dioxide is 7 to 100% of the total thickness of the polyester resin layer. This sheet is for example a three layered symmetrical structure: wherein the two outer layers excluding the core layer, contain $TiO_2$ particles in a total amount of 5.5 to 40% w/w.

EP-1995789-A1 describes use of $TiO_2$ in the outer layers. An additional drawback of the biaxially oriented white polyester polymer films is the occurrence of peeling in the laminate caused by a weak adhesion between PET film and the other layers of the back sheet laminate due to presence of inorganic particles in outer layers of PET film. Particles in outer layer also induce chalking phenomenon after ageing.

SUMMARY OF THE INVENTION

In this context, one of the essential objectives of the present invention is to provide a biaxially oriented white polyester film that is an improvement to the polyester resin sheet according to the EP1995789A1, in order to provide a multilayer biaxially oriented white polyester film which satisfies simultaneously the six following requirements:
 (a) Imp roved adhesion properties at interface between film of the invention and other layers of the back sheet laminate.
 (b) Absence of chalking or powdering phenomenon after ageing
 (c) Improved opacity
 (d) Improved whiteness and reflectance
 (e) Improved hydrolysis resistance
 (f) Improved light stability Another essential objective of the present invention is to provide a method for manufacturing a biaxially oriented white polyester film and for controlling the hydrolysis resistance of said polyester film.

Another objective of the invention is to provide a method for obtaining a polyester film which satisfies to the above objectives, said method being simple to implement, cheap and industrial.

Another objective of the invention is to provide an improved solar or photovoltaic cell or battery, with regard to the above requirements 1), 2), 3), 4), 5), 6)

These objectives, among others, are achieved by the present invention which relates, in a first aspect, to a multilayer biaxially oriented white polyester film comprising at least three polyester layers, respectively a core layer and two outer layers that can be the same or different, and containing $TiO_2$ particles, wherein:

(i) at least one layer includes a PolyEthylene Terephthalate PET whose:
- number average molecular weight is comprised within the following ranges given herein in an increasing order of preference 18500-40000]; [19000 -35000]; [20000 -30000];
- intrinsic viscosity IV is included within the following ranges given herein in an increasing order of preference and in dL/g: [≥0.70]; [≥0.75]; [≥0.78]; [0.78-1.20];
- carboxyl group content is comprised between the following ranges given herein in an increasing order of preference and in eq/T: [≤30]; [≤25]; [≤21]; [≤15]; [5-15];

(ii) the core layer includes $TiO_2$ particles in the following concentration ranges given herein in an increasing order of preference and in % w/w: [0.1-40]; [0.5-30]; [1-20]; [2-10];

(iii) the intrinsic viscosity IV of the film is comprised between the following ranges given herein in an increasing order of preference and in dl/g: [0.5-0.85]; [0.55-0.8]; [0.6-0.75]; [0.65-0.75];

(iv) a small endothermic peak temperature, Tmeta measured on the film is comprised between 180-230° C., preferably between 180-220° C.;

(v) at least one light stabilizer is added, preferably in at least one of the outer layers, in a total concentration comprised between the following ranges given herein in an increasing order of preference and in % w/w: [0.1-35]; [0.2-25]; [0.3-20]; [0.4-10]; [0.5-5].

"Total concentration" means that all the stabilizer contained in the film is taken into account.

In a preferred embodiment, at least one of the outer layers contains $TiO_2$ particles. The concentration of $TiO_2$ in one or two outer layer is preferably included in the following concentration ranges given herein in an increasing order of preference and in % w/w: [<5]; [<4]; [0.01-3].

This multilayer biaxially oriented white polyester film presents simultaneously good properties of hydrolysis resistance, of light stability, of opacity, of whiteness, of adhesion at interface between film of the invention and other layers of the back sheet laminate, and no chalking. This polyester film is economical and simple to produce industrially.

This multilayer biaxially oriented white polyester film is suitably used as part of a back sealing laminate of a photovoltaic battery module. The reflective properties of the white sheet contribute to the improvement of the electrical transduction efficiency of solar cells. The white sheet enhances the moisture vapour barrier that allows a better protection of the solar cells and increases their durability. Furthermore, radiation in the UV region of the spectrum is attenuated, thereby obtaining excellent durability of the photovoltaic battery.

Advantageously, the Global Planar Sonic sheet tester (SST) Modulus of the film (GPSM) is comprised between the following ranges given herein in an increasing order of preference and in $kgf/mm^2$: [440-465]; [445-465]; [450-465].

The film has preferably at least one of the following remarkable characteristics:
- it has a total thickness comprised within the following ranges given herein in an increasing order of preference and in µm: [10-500]; [20-300]; [35-250].
- no chalking phenomenon, represented by a powdering on the surface of the film, is observed before or after natural or accelerated ageing.
- It comprises a flame retardant
- It comprises a radical scavenger,
- It comprises at least one coating on at least one side, said coating being obtained by coextrusion, coating, extrusion coating, corona treatment under ambient air or gases, vacuum evaporation, plasma treatment or physicochemical vacuum deposition.

In a second aspect, the invention satisfies the aforementioned objectives by providing a method for manufacturing a multilayer biaxially oriented white polyester film, notably the above mentioned one according to the invention and for controlling the hydrolysis resistance of said polyester film, the said method therefore being characterized in that it consists essentially in:

a. Synthesizing or implementing one or several different polyesters, preferably PET(s);
b. Adding $TiO_2$ and at least one light stabilizer in polyester(s),
c. Possibly Pre-drying the polyester(s);
d. Heating the polyester(s) to melt it and make it malleable;
e. Extruding the melted polyester(s) and processing into a multilayered film;
f. Quenching and solidifying the multilayered film;
g. Subjecting the multilayered film to biaxial stretching in the longitudinal and transverse directions at a given stretching temperature Ts;
h. Heating the stretched film at a given heating temperature Th;

wherein Ts and/or Th are selected so that the endothermic peak temperature, Tmeta, be maintained below 240° C., preferably between 180-230° C., more preferably between 180-220° C., in order to control the hydrolysis resistance of said polyester film.

In a third aspect, the invention concerns laminates comprising the film according to the invention.

In a fourth aspect, the invention concerns a solar or photovoltaic cell or battery whose back sheet comprises the film according to the invention.

According to the present invention, there can be provided an inexpensive and excellent thermoplastic film for photovoltaic batteries which enhances the electrical transduction efficiency of photovoltaic battery by improving simultaneously the hydrolysis resistance, the light stability, the opacity, the whiteness, the adhesion at interface between film of the invention and other layers of the back sheet laminate, as well as the non-chalking of the said film. This latter can be suitably used for photovoltaic batteries in "roof top" or "solar farm" environments, for flexible photovoltaic, and for electronic parts.

DETAILED DESCRIPTION OF THE INVENTION

It should be noted that in this text, every "singular" shall be construed as a "plural" and vice versa.

The Multilayered White Polyester Film

As an example, the multilayered white polyester film according to the invention can be part of the back sheet of a photovoltaic battery. A photovoltaic battery (or solar cell) is a system that converts sunlight into electricity. Preferably, the structure of the photovoltaic battery is based on a structure of a high light transmission material, a photovoltaic battery module, a filled resin layer and a backside protection laminate as in the structure shown in FIG. 1. The photovoltaic battery can be mounted onto domestic or industrial building roof tops, or used in solar farms or used for electric/electronic parts.

Figure 1:
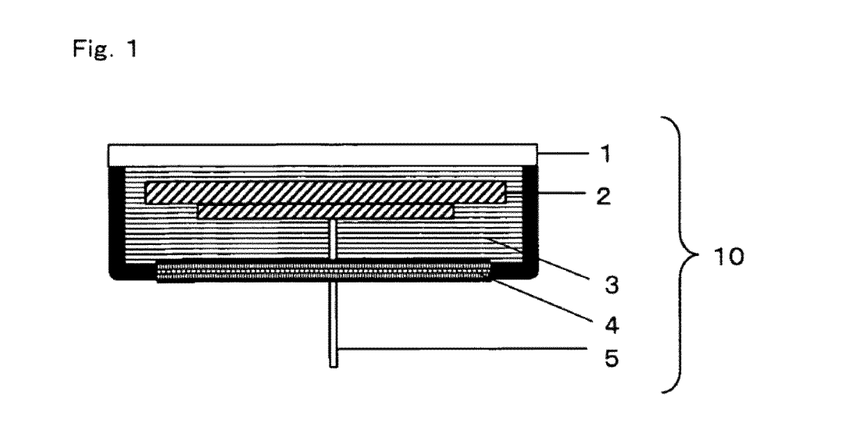
FIG. 1 is a cross-sectional view illustrating a photovoltaic battery whose backsheet includes the multilayered white polyester film according to the invention.

The photovoltaic battery shown in FIG. 1 comprises a total light transmission material 1 (for instance glass), a photovoltaic battery cell 2, a filled resin 3 (also called encapsulant), a photovoltaic battery backside protection laminate 4 and a lead wire 5.

Figure 2:
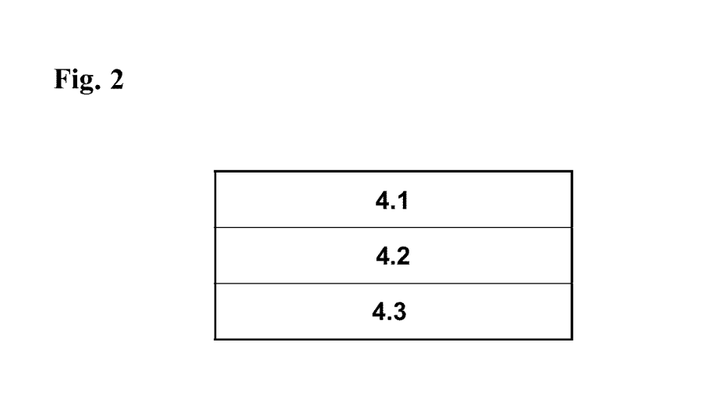
FIG. 2 is a cross-sectional view illustrating an example of the multilayered white polyester film according to the invention.

The film of the invention, part of the photovoltaic battery backside protection laminate 4 is shown on FIG. 2. This is a three layer polyester film made preferably of PET (outer layers 4.1 & 4.3) and PET-$TiO_2$ (core layer 4.2), which possesses the above mentioned features (i) to (vi).

The present invention encompasses laminates, notably the backsheet laminates for photovoltaic batteries. The laminates according to the invention have a peel strength (90°) greater than or equal to 5N, which corresponds to improved adhesion properties at the interface between film of the present invention and other films of the back sheet laminate.

Said peel strength (90°) is measured according to the test hereinafter described.

Polyester Resins

The polyester layers of the films according to the invention are for example essentially linear aromatic polyester, obtained from an aromatic dibasic acid or from an ester derived from said acid, and from a diol or from an ester derived from said diol.

The polyester constituting each layer of the multilayer film can be selected from the polyesters that are usually used in order to obtain biaxially oriented semi-crystalline films. They are film-forming linear polyesters, crystallisable by orientation and obtained in the usual way from one or more aromatic dicarboxylic acids or derivatives thereof (esters of lower aliphatic alcohols or halides for example) and one or more aliphatic diols (glycols).

As examples of aromatic acids, there may be mentioned the phthalic, terephthalic, isophthalic, 2,5-naphthalenedicarboxylic, and 2,6-naphthalenedicarboxylic acids. These acids can be combined with a smaller quantity of one or more aliphatic or cycloaliphatic dicarboxylic acids, such as adipic, azelaic, tetra- or hexahydroterephthalic acids.

As non-limitative examples of aliphatic diols, there may be mentioned ethylene glycol, 1,3-propanediol, 1,4-butanediol, cycloaliphatic diols (cyclohexanedimethanol), neopentylglycol. These diols can be used separately or as a combined mixture thereof.

Preferably, the film-forming crystallisable polyesters are polyterephthalates or alkylenediol polynaphthalenedicarboxylates and, in particular, polyethylene terephthalate (PET) or 1,4-butanediol or copolyesters having at least 80 mol. % of ethylene glycol terephthalate units.

The biaxially oriented multilayer polyester films are, for example, containing:
  either polyethylene terephthalate,
  or mixtures, or not, of polyethylene terephthalate copolyesters containing cyclohexyl dimethylol units instead of the ethylene units (see patent U.S. Pat. No. 4,041,206 or EP-A-0408042),
  or mixtures, or not, of polyethylene terephthalate copolyesters with a polyester portion having isophthalate units (see patent EP-B-0515096),
or are constituted by several layers of polyesters of different chemical natures, as described previously, obtained by coextrusion.

Specific examples of aromatic polyesters are in particular polyethylene terephthalate, polyethylene isophthalate, polybutylene terephthalate, poly-(dimethyl-1,4-cyclohexylene terephthalate) and polyethylene-2,6-naphthalenedicarboxylate. The aromatic polyester can be a copolymer of these polymers or a mixture of these polymers with a small quantity of other resins. Among these polyesters, polyethylene terephthalate (PET) and polyethylene-2,6-naphthalenedicarboxylate (PEN) and polybutylene terephthalate (PBT) are particularly preferred as they offer a good balance between physical properties, mechanical properties and optical properties.

Advantageously, the polyethylene terephthalate resin with improved hydrolysis resistance (HRPET) which is used for the present invention presents a high intrinsic viscosity (IV>0.78 dL/g) and a low carboxylic groups content ([COOH]<15 eq/T). The intrinsic viscosity is directly related to the molecular chains length. The carboxylic groups content is representative of polyethylene terephtlate chain ends. The lower the carboxylic groups content is, the longer the molecular chains are. A low carboxylic groups content in combination with a high intrinsic viscosity give to the biaxially oriented film an excellent hydrolysis resistance in comparison with the one that can be achieved with standard polyethylene terephthalate polymers for the production of biaxially oriented PET films (0.62<standard IV<0.70 dL/g and 25<standard [COOH]<40 eq/T). The above described polyester resin has preferably a number average molecular weight of 18500 to 40000.

White Pigments

Suitable white pigments are especially titanium dioxide, barium sulphate, calcium carbonate or incompatible polymers such as polypropylene, polyethylene or cycloolefin copolymers (COC), or combinations thereof. Particular preference is given to titanium dioxide ($TiO_2$). Preferably, the $TiO_2$ particles which are used in the core layer of the present invention are composed of the rutile crystalline form. The $TiO_2$ particles are obtained by the chloride process and they have a surface post treatment (inorganic and/or organic) to reduce photocatalytic effect and to improve dispersability. More preferably, the TiO2 particles which are used in the film of the invention can be Sachtleben RD3® from Sachtleben, Tronox CR-826® from Tronox, Kronos 2220® from Kronos.

The titanium dioxide particles can be introduced in the film by any conventional method. For example, the introduction can be done during the esterification stage of the polymerisation following which a polymer condensation reaction can be performed.

Advantageously, $TiO_2$ particles are introduced from a white master batch (WMB2) which is obtained by performing solid phase polymerization under vacuum and high temperature using white master batch WMB1 as the starting raw material. WMB1 is obtained by melting and mixing 40% weight parts of a high IV polyethylene terephthalate (IV>0.80 dL/g) to 60% weight part of titanium dioxide ($TiO_2$) particles. The white master batch WMB1 can also contain an antioxidant (so-called radical scavenger or thermal stabilizer) from the phenolic family (Irganox® 1010 from BASF with RNCas.6683-19-8) in order to prevent the PET resin from thermo-oxydative degradation. The final intrinsic viscosity of WMB2 is above 0.80 dL/g and the concentration of carboxylic groups lower than 35 eq/T.

In another variant, the radical scavenger is incorporated for instance through an additional master batch.

Light Stabilizer

According to the invention, at least one of the layers of the film, more preferably the outer layers of the film include preferably at least one light stabilizer in above mentioned preferred concentrations. Light stabilizers are used for countering the effects of light (UV) and oxygen on the polyester film.

The light stabilizers can be selected from several groups of known products such as those described in the work "*Additives for plastics on book*, John Murphy, $2^{nd}$ Edition 2001, *Elsevier Advanced Technology*" and more specifically for PET films such as those described in patent U.S. Pat. No. 6,593,406.

As examples of light stabilizers described in patent WO 2009/083552 A1, there may be mentioned:
the family of antioxidants or UV-absorbers such as benzophenones, benzotriazoles, benzoxazinones and triazines;
the family of "Hindered Amine Light Stabilizers" (HALS), alone or in combination with antioxidants.

The polyester film will preferably comprise at least one light stabilizer additive, and even more preferably an UV-absorber of the triazine type with two phenyl or two biphenyl groups (Tinuvin®1577 from BASF with RNCas 147315-50-2, CyasoreUV-1164 from Cytec, CGX-006 from BASF).

The light stabilizer can be advantageously introduced in the film from a Master Batch (UVMB), which is obtained by melting and mixing 85% weight parts of a super high IV polyethylene terephthalate (IV>1 dL/g) to 15% weight part of a light stabilizer in order to maintain a final IV above 0.80 dL/g and a concentration of carboxylic groups lower than 28 eq/T.

Other Additives

Some fillers other than $TiO_2$ can be included in the polyester in order to modify its properties. These fillers can be included alone or as mixtures in the film. As examples of commonly known fillers for polyester films, there is calcium carbonate, calcium oxide, aluminium oxide, kaolin, silica, zinc oxide, carbon black, silicon carbide, tin oxide, particles of cross-linked acrylic resin, particles of cross-linked polystyrene resin, particles of cross-linked melamine resin, particles of cross-linked silicone resin or similar may be mentioned. Fillers of the silica and/or carbonate type are preferably used.

Moreover, if necessary, the polyester film can further contain at least one other additive, preferably selected from the following group: radical scavenger, flame retardant, dye, antistatic agent, antioxidant, organic lubricant, catalyst or any other similar additive.

Surface Treatment

The film of the invention can have a surface treatment on at least one side, to improve adhesion, antistatic performance, slip and winding performances and/or processing performances. The surface treatment can be a physical surface treatment (for example UV, corona treatment under ambient air or gases, vacuum evaporation, plasma treatment or physicochemical vacuum deposition) or a chemical surface treatment (for example coating of acrylic, copolyester, polyester or polyurethane based formulations). The chemical surface treatment can be obtained by coextrusion, extrusion coating, in-line coating done prior to transverse stretching during the film making process or off-line coating.

The Method for Manufacturing a Biaxially Oriented Polyester Film

The aromatic polyester film can be obtained by melt extrusion through a slot die, which produces an aromatic polyester molten web, which is then subsequently cooled and solidified on a forming drum to obtain an unstretched film. The unstretched film is then stretched at a temperature between the glass transition temperature Tg and a temperature equal to Tg+60° C. in the longitudinal direction, one or more times (for example from 3 to 6 times), then the film is stretched at a temperature between Tg and Tg+60° C. in the transverse direction with a stretching ratio of 3 to 5 times. The biaxially stretched film is then heat-treated at a temperature between 180 and 250° C. for 1 to 60 seconds for example and then at a lower temperature in order to stabilize the film.

The polyester film can be of simple structure or coextruded ABA or ABC (with the symbols A, B and C corresponding to layers with different or same nature and/or composition).

The method for manufacturing a multilayer biaxially oriented white polyester film, notably the above mentioned one according to the invention is also a method for controlling the hydrolysis resistance of said polyester film. Said method consists essentially of the steps a,b,c,d,e,f. The selection of stretching temperature Ts and/or heating temperature Th so that a small endothermic peak temperature, Tmeta, be maintained at inventive values, in order to control the hydrolysis resistance of said polyester film, is particularly remarkable. It makes it possible to reach the outstanding properties in terms of % retention elongation MD after 48 h of pressure cooker test notably.

An example of a method for producing the PET multilayer white film for photovoltaic batteries of the present invention can be described as follows:

Step a

For example, terephthalic acid or derivative thereof and ethylene glycol are subjected to ester interchange reaction by a well-known method. Examples of a reaction catalyst include alkali metal compounds, alkaline earth metal compounds, zinc compounds, lead compounds, manganese compounds, cobalt compounds, aluminium compounds, antimony compounds, and titanium compounds. Examples of a colouring agent include phosphorus compounds. It is preferable that an antimony compound or a germanium compound and a titanium compound be added as polymerization catalysts. For such a method, in the case of adding, for example, a germanium compound, it is preferable to add germanium compound powders.

A preferable example of the method for controlling the number average molecular weight of the polyester resin of the present invention to be 18500 to 40000 includes a so-called method of solid phase polymerization which comprises the steps of polymerizing a usual polyester resin having a number average molecular weight of 18000 by the above-described method and heating at a temperature ranging from 190° C. to a temperature being less than a melting point of polyester resin under reduced pressure or circulation of inert gas such as nitrogen gas. The method can increase the number average molecular weight without increasing the amount of the terminal carboxyl group of polyester resin.
Step b $TiO_2$ and additives such as light stabilizer are preferably added in polyester(s), via PET-based master batches with high viscosity. Advantageously, $TiO_2$ particles are introduced from a white master batch (WMB2) which is obtained by performing solid phase polymerization under vacuum and high temperature using white master batch WMB1 as the starting raw material.

WMB1 contains preferably at least 40% by weight of $TiO_2$ particles.

WMB2 has a final IV above 0.80 dL/g and a concentration of carboxylic groups lower than 35 eq/T.

The light stabilizer can be advantageously introduced in the film from a Master Batch (UVMB), with a final IV above 0.80 dL/g and a concentration of carboxylic groups lower than 28 eq/T.
Step c & d Subsequently, when the PET multilayer film for photovoltaic batteries is formed from the previously described polymer, the method can include the step c of drying the polymer to a pre-determined moisture content limit, if necessary (notably when single screw extruders are used), and the step d of making a multilayer film with the polyester resin delivered from different passages in two or more extruders with the use of a static mixer or similar device in each channel leading to a feed-block or a multimanifold die, or the like. Alternatively, these steps c & d may be combined.
Steps e & f The multilayer sheet that is discharged from a slot die is extruded onto a cooling body such as a casting drum, which is then cooled and solidified to form a casting sheet. In this case, it is preferable that the sheet be adhered tightly to the cooling body such as a casting drum by an electrostatic force by using an electrode with shapes such as a wire-shape, a tape-shape, a needle-shape, or a knife edge-shape, which is then quenched and solidified.

In another variant, the sheet can be adhered tightly to the cooling body by other well known means, such as an air blade, water meniscus, suction box, glycol moisture, and all methods well-known from the art. Alternatively, all these methods may be optionally combined.
Step g The casting film thus obtained may be optionally subjected to biaxial stretching. The term "biaxial stretching" means stretching in the longitudinal and transverse directions. The stretching may be sequential biaxial stretching, whatever is the order of the sequences, or simultaneous biaxial stretching. Further, the re-stretching may be performed in a longitudinal and/or transverse direction.

The term "stretching in the longitudinal direction" means stretching to produce a molecular orientation in the longitudinal direction of the film. It is usually given by a roll peripheral speed difference. The stretching may be performed in one step. Alternatively, the stretching may be performed at multiple stages with a plurality of roll pairs. The stretching ratio depends on the type of resin. The method of stretching can be a combination of contact roll heating and other means of heating, like, but, without limitation, radiation heaters of short or medium wavelength, heating tapes, hot air blown from nozzles, and, in a non limitative way can follow all the possibilities of the previous known art. Alternatively, all these methods may be optionally combined. Usually, the combined stretch ratio (longitudinal ratio×transverse ratio) is preferably 2 to 25 times. For example, for PET, the stretching ratio in the longitudinal direction is preferably 2 to 6 times.

If the biaxial stretching of the film is generally carried out sequentially with the first orientation longitudinally, it is also possible to first orient transversally then longitudinally, or to use simultaneous stretching.

Figure 3:
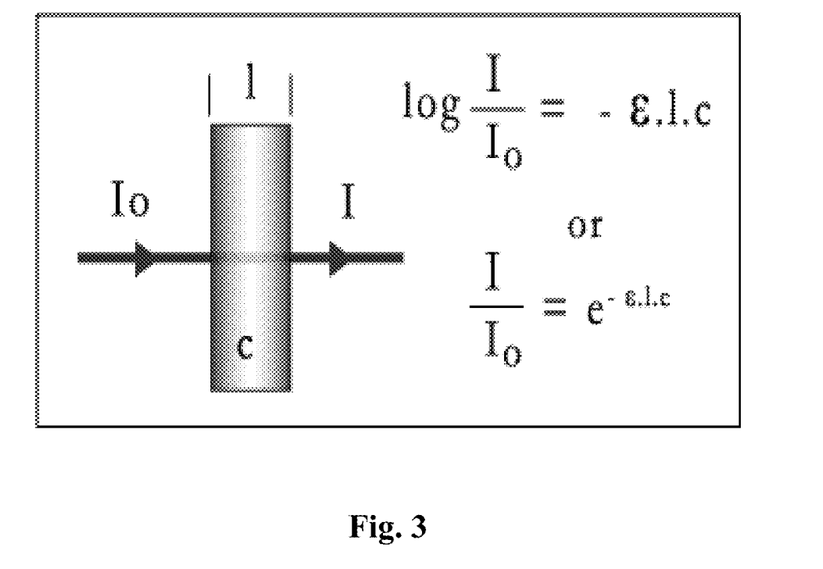
FIG. 3 illustrates the Beer-Lambert law where $I_0$ is the light energy of monochromatic incident source; I is the light energy transmitted through the material; l is optical length (m); c is the concentration of absorbing species (mole/L); c is the molar extinction coefficient of absorbing species (L/mole*m); and ($-\log I/I_0$) is absorbance or optical density.

Then, in order to stretch the film in the transverse direction, the film is passed through a diverging rail set to the stretching ratio of 2 to 5 times. The clips hold the edges of the film, and stretched in the transverse direction (machine cross-direction). The stretching temperature Ts of the film is 85 to 140° C., and the film is stretched in the transverse direction.
Step h In a subsequent step, heat treatment is performed at Th of 180 to 245° C. in order to obtain dimensional stability, and the polyester resin sheet for photovoltaic batteries of the present invention is produced.
Examples The invention will be better understood and its advantages will become apparent from the examples given below. Hereinafter, physical properties, evaluation method thereof, and criteria of evaluation which are used in the present invention will be described.
Physical Properties of Polymer and Film
Thickness The preferred total thickness has been given above. The Beer-Lambert law describes that the capacity to absorb UV radiation is proportional to the sample' thickness and to the concentration of the UV absorber which is present in the sample $$\mathrm{Log}\ (I/I_0) = -\epsilon \cdot l \cdot c$$

$$(I/I_0) = e^{-\epsilon \cdot l \cdot c}$$

With:
Io=Light energy of momochromatic incident source
I=Light energy transmitted through the material
l=optical length (m)
c=concentration of absorbing species (mole/L)
$\epsilon$=Molar extinction coefficient of absorbing species (L/mole-m)
(−Log I/Io) is also called Absorbance or optical density
Mechanical Properties In this invention it is an advantage that the said preferably biaxially stretched polyester white film has a high planar orientation. A suitable non-destructive method for the characterisation of such a property is the determination of the speed of propagation of ultrasound waves within the plane of the said film and measured successively in all directions to characterise the global planar orientation by calculating the Global Planar Sonic sheet tester (SST) Modulus of the film (GPSM).

The speed of the supersonic pulse is measured in a given direction over a given distance following the standard ASTM F89-68 for the determination of the Sonic Modulus of a flexible barrier material by Sonic Method, using an SST-250 Sonic sheet tester manufactured by Nomura Shoji. Co. ltd, Japan. A "modulus" is calculated using an empirical correlation:

$$E=92*v^2$$

With:
E=modulus in kgf/mm$^2$
v=speed of ultrasound propagation in sample in km/s
By rotating the sample progressively by 5° angle increments from 0° (MD) to 175° (TD+85°), a global planar SST modulus (GPSM) can be calculated from the average of the 36 individual measurements within the plane.

Number Average Molecular Weight

Molecular weight calibration is performed using polystyrene (standard reference). Measurement on the polyester resin film for back sheet laminates of photovoltaic modules is made at room temperature (23° C.) with 244 type gel permeation chromatograph GCP-244 (manufactured by WATERS), two columns: Shodex K 80M (manufactured by Showa Denko K.K.) and one column: TSKGEL-G2000Hx1 (manufactured by TOSOH CORPORATION).

Coefficient (A1) of the third approximation is calculated using elution volume (V) and molecular weight (M) and calibration curves are established:

$$\log(M)=A_0+A_1*V+A_2*V^2+A_3*V^3$$

After calibration, a sample of the polyester resin film for back sheet laminate of photovoltaic modules is dissolved in a solvent of orthochlorophenol/chloroform (volume ratio ¼) so as to be 0.2% (wt/vol). The quantity injected to the chromatograph is 0.400 mL and the injection is performed at a flow rate of 0.8 mL/min. As a detector, R-401 differential-refractive index detector (WATERS) is used, and the number average molecular weight is calculated by the following equation:

$$Mn=\text{sum}(Ni*Mi)/\text{sum}(Ni)$$

Molar fraction Ni and molecular weight Mi corresponding to each retention volume Vi.

Intrinsic Viscosity

A sample solution is obtained by dissolution of a given quantity of the sample (polymer or film) at least at 120° C. for 30 min in 100 mL of a solvent mixture of 1,2-dichlorobenzene/phenol 50/50. After cooling down, the elution time of the sample solution is measured with an Ubbelhode viscosimeter. The intrinsic viscosity value IV of the sample is calculated according to the standard ISO 1628/5 using the following correlations.

The viscosity of the pure solvent mixture $\eta_0$ is compared to the viscosity of the sample solution $\eta$. The relative viscosity $\eta_r$ is given by:

$$\eta_r=\eta/\eta_0=t*\rho/t_0*\rho_0$$

With:
$t_0$ and $\rho_0$ are the elution time and density of the solvent mixture
t and $\rho$ are the elution time and density of the sample solution
Since $\rho\sim\rho_0$ in our case of study, the following equation for specific viscosity $\eta_{sp}$ is then obtained: $\eta_{sp}=\eta_r-1=(t-t_0)/t_0$
The correlation between $\eta_{sp}$ and intrinsic viscosity IV is given by:

$$(\eta_{sp}/C)=IV+k*IV^2*C$$

with:
($\eta_{sp}$/C) viscosity number.
C: concentration of polymer in solution
k: constant The intrinsic viscosity IV can be determined experimentally by measuring the viscosity number ($\eta_{sp}$/C) as function of concentration C as the Y-axis intercept.

COOH Content

Concentration fo terminal carboxyl groups is measured by the so-called titration method. Specifically, the sample is dissolved at 100° C. for 30 min of 0.5 g of sample in 10 g of a solvent mixture o-cresol/$H_2O$ 17/1. After dissolution and cooling, add 3 mL of $CH_2Cl_2$. Titration is performed with a KOH 0.02N solution.

A blank sample of solvent mixture o-cresol/$H_2O$ 17/1 is titrated by the same method.

The carboxyl group content [COOH] is calculated by the following equation:

$$(V-V_0)t/P$$

Vo (L) KOH volume used for titration of blank sample
P (g): sample weight
V (L): KOH volume used for titration of sample
t: KOH solution concentration (0.02N or 0.02 mol/l)

Thermal Properties

The small endothermic peak temperature, Tmeta mentioned previously, is measured by DSC differential scanning calorimetry (DSC Diamond from Perkin-Elmer). This method is used to study thermal transitions of polymers. The polymer is heated up to 250° C. (10° C./min) under nitrogen flow.

Criteria of Film Evaluation

Hydrolysis Resistance

To characterize the hydrolysis resistance, the polyester film is subjected to ageing in a Pressure Cooker Test (PCT) (SYSTEC VE-100) with the following conditions: temperature 125° C., relative humidity 100%, pressure 2.3 bars. The retention ratio of elongation to break is measured after 48 h of the ageing test. (cf. table of examples p. 17)

Light Stability

To characterize the light stability, the polyester film is subjected to an outdoor exposure acceleration test in a UVCON (Atlas) device with test conditions according to ISO 4892-3 Method A, cycle 1:
Type of lamp: 1A (UVA340) (fluorescent lamp)
Exposition cycle: After performing the ultraviolet irradiation (0.76 W.m$^{-2}$.nm-1 at 340 nm) at a temperature of 60° C. (+1-3° C.) in dry conditions for 8 hours, aging for 4 hours is performed in a dew condensation state at temperature 50° C. (+/−3° C.), in an atmosphere with relative humidity of 100% (light off). The exposition cycle is performed up to 1000 hours minimum (cf. table of examples p. 17)

After the ageing test, the retention ratio of elongation to break is evaluated and the delta b* is measured to characterise the light stability.

Retention Ratio of Elongation

The elongation to break (%) is measured according to ASTM D-882, with dynamometer INSTRON 5543 with detector of 1 kN. The samples are normalized 100*15 mm. The elongation to break without ageing is considered 100% and the retention ratio of the elongation to break without ageing to the elongation to break after ageing is calculated.

The retention ratio is measured after 48 h of Pressure Cooker Test in SYSTEC VE-100 and after 1000 h of outdoor exposure acceleration test in UVCON.

The retention ratio is determined by the following ranking:
A: the retention ratio is 70% or more. Considered as good.
B: the retention ratio is 50-70%. Considered as medium.

C: the retention ratio is lower than 50%. Considered as bad.

Delta b*

After performing the outdoor exposure acceleration test, the coloration of the film is measured in terms of b* value by transmission measurement with MINOLTA CM-508d Spectrocolorimeter.

Colour measurements are done in accordance with ISO 7724 (03/1988) (specular reflection included—under D65 illuminant) and the difference between the b* value after the outdoor exposure acceleration test (1000 h in UVCON) and b* value before the outdoor exposure acceleration test is calculated:

Delta $b^* = b^*$after ageing$-b^*$before ageing and evaluated according to the following ranking:
A: Delta b*<2.5. Significantly good light stability
B: Delta b* comprised between 2.5 and 4. Improved light stability
C: Delta b*>4. Poor light stability Total Light Transmittance The film according to the invention has special optical properties given by Total Light Transmittance TLT of the film. It is measured using a hazemeter BYK-Gardner Haze-Guard Plus in accordance with ASTM D-1003.

The targeted film aims to be white with sufficient opacity according to following TLT ranking:
A: TLT is less than 40%. Considered as good.
B: TLT is 40-60%. Considered as medium.
C: TLT is more than 60%. Considered as bad.

White Index

The white index of the film is measured using a spectrophotometer Minolta CM508i in accordance with ASTM E-313.

Evaluation is determined according to the following ranking:
A: white index is more than 88. Considered as good.
B: white index is 84-88. Considered as medium.
C: white index is less than 84. Considered as bad.

Relative Reflectance

A spectrophotometer (U-3310, manufactured by Hitachi Ltd) is used. Alumina oxide is used as a standard white plate. At 560 nm, the angle of gradient of the opening portion of the specimen is 10°. The diffuse reflectance is measured and designated as ($T_0$). The reflectance of the standard plate is 100%. Then the opening portion of the specimen is replaced by the specimen and diffuse reflectance is measured at 560 nm.

Then the diffuse reflectance is converted into the relative reflectance (R) by using the following equation:

$R\ (\%) = T_1/T_0 * 100$ $T_0$: reflectance of a standard white plate and $T_1$: reflectance of specimen.

Evaluation is determined according to the following ranking:
A: relative reflectance at 560 nm is more than 70%. Considered as good.
B: relative reflectance at 560 nm is 40-70%. Considered as medium.
C: relative reflectance at 560 nm is less than 40%. Considered as bad.

Peel Strength

The behaviour of film when used in a laminate was tested by means of an adhesion test. The film side intended to be dry laminated is corona treated before adhesive deposit (5 μm). Urethane adhesive (Takerakku A-1106/Takeneto A-23, 6/1) is dried for 45 sec, 45° C. An ageing of 96 hours at 50° C. is performed on sample (15 mm wide).

The peeling strength is measured at 200 mm/min, 90° peeling angle in the machine direction (MD).

Evaluation is determined according to the following ranking:
A: Peel strength >5 N: good adhesion
B: Peel strength 4-5 N: medium adhesion
C: Peel strength <4 N: bad adhesion Chalking The chalking phenomenon is represented by a powdering on the surface of the film that can occur before or after natural or accelerated ageing. A tape test is done to evaluate the chalking phenomenon. A transparent tape is positioned on surface of the film and removed. The presence or absence of powder on the tape gives an evaluation of the chalking phenomenon.

Evaluation is determined according to the following ranking:
A: No powder on tape. Film presenting no chalking is considered as good.
C: Powder on tape. Film presenting chalking is considered as bad.

Examples

One hundred parts by weight (hereinafter simply referred to as parts) of dimethyl terephtalate was mixed with 64 parts of ethylene glycol, to this, 0.1 parts of zinc acetate and 0.03 parts of antimony trioxide were added as catalysts. Ester interchange was performed with a circulation temperature of ethylene glycol. Trimethylphosphate 0.08 parts were added to the resulting product, which was gradually heated up and polymerized under reduced pressure at a temperature of 271° C. for 5 hours.

The inherent viscosity of the obtained polyethylene terephthalate was 0.55. The polymer was cut into a chip with a cylindrical shape with a length 5.95-8.05 mm, width 3.20-4.80 mm, and height 1.70-2.30 mm. The specific gravity was 1.3 g/cm3. The PET was placed in a rotary vacuum dryer (high polymerization temperature: 190-230° C., degree of vacuum 0.5 mmHg) and heated while stirring for 10 to 23 hours. Thus a HRPET, polyethylene terephthalate polymer with high intrinsic viscosity (IV=0.82 dL/g), a low carboxylic groups content [COOH]=14 eq/T and a number average molecular >20000 was obtained.

The aromatic polyester film is obtained by melt extrusion through a slot die, which produces an aromatic polyester molten web, which is then cooled and solidified on a forming drum to obtain an unstretched sheet. The sheet thus obtained by quenching-solidification is guided to a roll-group heated at 80-130° C., and is stretched 3-5 times in the longitudinal direction and then cooled by a roll-group of 21-25° C. Subsequently, the longitudinally stretched film is guided into a tenter while both edges are held by clips. Then, the film is stretched 3-4.5 times in the transverse direction at 100-135° C. Thereafter, the resulting film is subjected to heat fixing in the tenter and uniformly slowly cooled in order to be thermally stabilized. The film is cooled to room temperature and wound to obtain a roll of film having a thickness of 50 μm.

The films in the examples and comparative examples below are all mono- or multilayer biaxially oriented films of 50 μm, produced on an extrusion line. Unless otherwise stated, the polyethylene terephthalate polymer from which the films were produced is an HRPET.

The films were tested for TLT, white index, reflectance, adhesion, chalking, hydrolysis resistance and/or light resistance. Therefore, the films were possibly subjected to an outdoor exposure acceleration test in device UVCON (Atlas) with test conditions according to ISO 4892-3, and to ageing in a Pressure Cooker Test (PCT) (SYSTEC VE-100). Results are presented in Table 1.

Example 1

Pellets of hydrolysis resistant polyethylene terephthalate (HRPET), pellets of white master batch (WMB2) and pellets of UV-absorber Master Batch (UVMB) were dried, melted and extruded through a slit die onto a rotating cooling drum to provide an unstretched 3-layer white film. The unstretched 3-layer white film was submitted to longitudinal and transversal stretching at a given stretching temperature Ts and finally exposed to a heating temperature Th for the purpose of thermal fixation and hydrolysis resistance control. The corresponding small endothermic peak Tmeta measured at 215° C.

The White Master Batch (WMB2) is obtained by performing solid phase polymerization under vacuum and high temperature using WMB1 as the starting raw material which is obtained by melting and mixing 40% weight parts of a high IV polyethylene terephthalate to 60% weight part of titanium dioxide ($TiO_2$) particle. The final intrinsic viscosity of WMB2 is above 0.80 dL/g and the concentration of carboxylic groups lower than 35 eq/T.

The light stabilizer Master Batch (UVMB) is composed of 20% UV-absorber Tinuvin 1577® and 80% polyethylene terephthalate with an intrinsic viscosity above 0.80 dL/g and a concentration of carboxylic groups lower than 28 eq/T.

The 3-layer white film, comprising 8% of rutile type titanium dioxide (Kronos 2220® from Kronos) and 1.5% of UV absorber (Tinuvin 1577® BASF), exhibits IV of 0.685 dL/g and GPSM of 451 kgf/mm².

This film is rated A for all performances presented in Table 1.

Comparative Example 2

A method based on example 1 was used to produce a monolayer biaxially oriented white film of 50 μm, comprising standard polyethylene terephthalate (IV=0.640 dL/g, high [COOH]=35 eq/T and Mn=19000) as main constituent and 5% titanium dioxide. The small endothermic peak Tmeta is measured at 216° C. The film exhibits IV of 0.615 dL/g and GPSM of 450 kgf/mm². Results are presented in Table 1.

Comparative Example 3

A method based on example 1 was used to produce a 3-layer biaxially oriented transparent film of thickness 50 μm comprising as main constituent an hydrolysis resistant PET (HRPET) and 1.5% of UV absorber (Tinuvin 1577® BASF). The small endothermic peak Tmeta is measured at 214° C. The film exhibits IV of 0.695 dL/g and GPSM of 456 kgf/mm². Results are presented in Table 1.

Comparative Example 4

A method based on example 1 was used to produce a 3-layer biaxially oriented white film of thickness 50 mm comprising standard polyethylene terephthalate (IV=0.640 dL/g, high [COOH]=35 eq/T and Mn=19000) as main constituent and 14% of rutile-type titanium dioxide WMB2 in outer layers. The small endothermic peak Tmeta is measured at 213° C. The film exhibits IV of 0.618 dL/g and GPSM of 451 kgf/mm². Results are presented in Table 1.

Comparative Example 5

A method based on example 1 was used to produce a monolayer biaxially oriented transparent film of 50 μm comprising polyethylene terephthalate (IV=0.705 dL/g, [COOH]=30 eq/T and Mn=21000) as main constituent. The small endothermic peak Tmeta is measured at 215° C. The film exhibits IV of 0.650 dL/g and GPSM of 452 kgf/mm². Results are presented in Table 1.

Comparative Example 6

A method based on example 1 was used to produce a monolayer biaxially oriented transparent film of 50 μm comprising polyethylene terephthalate (IV=0.800 dL/g, [COOH]=40 eq/T and Mn=23000) as main constituent. The small endothermic peak Tmeta is measured at 214° C. The film exhibits IV of 0.740 dL/g and GPSM of 451 kgf/mm². Results are presented in Table 1.

Comparative Example 7

A method based on example 1 was used to produce a monolayer biaxially oriented transparent film of 50 μm comprising HRPET as main constituent. The small endothermic peak Tmeta is measured at 215° C. The film exhibits IV of 0.698 dL/g and GPSM of 456 kgf/mm². Results are presented in Table 1.

Comparative Example 8

Like the film of example 7 except that the film was processed with Ts and Th suitably chosen to obtain a standard Tmeta of 225° C. The film exhibits IV of 0.698 dL/g and GPSM of 456 kgf/mm². Results are presented in Table 1.

Comparative Example 9

Like the film of example 7 but the film was processed with suitably chosen process parameter to obtain a low global planar SST modulus (GPSM) of 440. The small endothermic peak Tmeta is measured at 214° C. The film exhibits IV of 0.698 dL/g. Results are presented in Table 1.

TABLE 1

|  | Example | Comparative examples | | | | | | | |
| --- | --- | --- | --- | --- | --- | --- | --- | --- | --- |
|  | 1 | 2 | 3 | 4 | 5 | 6 | 7 | 8 | 9 |
| white index | A | A | C | A | C | C | C | C | C |
| TLT | A | A | C | A | C | C | C | C | C |
| relative reflectance | A | A | C | A | C | C | C | C | C |
| retention ratio elongation MD (48 h PCT) | A | — | A | — | B | C | A | B | C |
| retention ratio elongation MD (1000 h UV ageing) | A | — | A | — | — | — | C | C | C |
| delta b* (1000 h UV ageing) | A | C | A | B | — | — | C | C | C |
| peel strength | A | C | A | C | A | A | A | A | A |
| chalking | A | C | A | C | A | A | A | A | A |

The invention will be further described by the following numbered paragraphs:

1—A multilayer biaxially oriented white polyester film comprising at least three polyester layers, respectively a core layer and two outer layers that can be same or different, and containing $TiO_2$ particles, wherein:
(i) at least one layer includes a PolyEthyleneTerephthalate PET whose:
number average molecular weight is comprised within the following ranges given herein in an increasing order of preference 18500-40000]; [19000-35000]; [20000-30000];
intrinsic viscosity IV is included within the following ranges given herein in an increasing order of preference and in dL/g: [≥0.70]; [≥0.75]; [≥0.78]; [0.78-1.20];
carboxyl group content is comprised between the following ranges given herein in an increasing order of preference and in eq/T: [≤30]; [≤25]; [≤21]; [≤15]; [5-15];
(ii) the core layer includes $TiO_2$ particles in the following concentration ranges given herein in an increasing order of preference and in % w/w: [0.1-40]; [0.5-30]; [1-20]; [2-10];
(iii) the intrinsic viscosity IV of the film is comprised between the following ranges given herein in an increasing order of preference and in dl/g: [0.5-0.85]; [0.55-0.8]; [0.6-0.75]; [0.65-0.75];
(iv) a small endothermic peak temperature, Tmeta measured on the film is comprised between 180-230° C., preferably between 180-220° C.;
(v) at least one light stabilizer is added, preferably in at least one of the outer layers, in a total concentration comprised between the following ranges given herein in an increasing order of preference and in % w/w: [0.1-35]; [0.2-25]; [0.3-20]; [0.4-10]; [0.5-5].

2—Film according to paragraph 1, wherein at least one of the outer layers contains $TiO_2$ particles in a concentration comprised between the following ranges given herein in an increasing order of preference and in % w/w: [<5]; [<4]; [0.01-3].

3—Film according to paragraphs 1 or 2, wherein the global planar SST modulus of the film (GPSM) is comprised between the following ranges given herein in an increasing order of preference and in kgf/mm$^2$: [440-465]; [445-465]; [450-465].

4—Film according to paragraph 1, wherein no chalking phenomenon, represented by a powdering on the surface of the film, is observed before or after natural or accelerated ageing.

5—Film according to paragraph 1, having a total thickness comprised within the following ranges given herein in an increasing order of preference and in µm: [10-500]; [20-300]; [35-250].

6—Film according to paragraph 1, wherein the film comprises a flame retardant

7—Film according to paragraph 1, wherein the film comprises a radical scavenger.

8—Film according to paragraph 1, wherein it comprises at least one coating on at least one side, said coating being obtained by coextrusion, coating, extrusion coating, corona treatment under ambient air or gases, vacuum evaporation, plasma treatment or physicochemical vacuum deposition.

9—Method for manufacturing a multilayer biaxially oriented white polyester film according to paragraph 1 and for controlling the hydrolysis resistance of said polyester film, said method consisting of:
a. Synthesizing or implementing one or several different polyesters, preferably PET(s);
b. Adding $TiO_2$ and at least one light stabilizer in polyester(s),
c. Possibly Pre-drying the polyester(s);
d. Heating the polyester(s) to melt it and make it malleable;
e. Extruding the melted polyester(s) and processing into a multilayered film;
f. Quenching and solidifying the multilayered film;
g. Subjecting the multilayered film to biaxial stretching in the longitudinal and transverse directions at a given stretching temperature Ts;
h. Heating the stretched film at a given heating temperature Th;
wherein Ts and/or Th are selected so that the endothermic peak temperature, Tmeta, be maintained below 240° C., preferably between 180-230° C., more preferably between 180-220° C., in order to control the hydrolysis resistance of said polyester film.

10—Method according to paragraph 9, wherein in step b. $TiO_2$ is added via PET-based master batches; $TiO_2$ particles being preferably introduced from a white master batch WMB2 containing at least 40% of $TiO_2$, said white master batch WMB2 being obtained by performing solid phase polymerization under vacuum and high temperature using white master batch WMB1 as the starting raw material.

11—Laminate comprising the film according to paragraph 1 or obtained by the method according to paragraph 9.

12—Laminate according to paragraph 11 wherein the peel strength (90°) at interface between film of the present invention and other films of the back sheet laminate is greater than or equal to 5N.

13—Solar or photovoltaic cell or battery whose back sheet comprises the film according to paragraph 1 or obtained by the method according to paragraph 9.

It is to be understood that the invention is not limited to the particular embodiments of the invention described above, as variations of the particular embodiments may be made and still fall within the scope of the appended claims.

The invention claimed is:
1. A multilayer biaxially oriented white polyester film comprising at least three polyester layers, respectively a core layer and two outer layers that is the same or different, and containing $TiO_2$ particles, wherein:
(i) at least one layer includes a PolyEthyleneTerephthalate (PET) whose:
a. number average molecular weight comprises a range of 18500-40000;
b. intrinsic viscosity IV is included within a range of ≥0.70 in dL/g;
c. carboxyl group content comprises a range of ≤30 in eq/T;
(ii) the core layer includes $TiO_2$ particles at a concentration comprising a range of 0.1-40 in % w/w;
(iii) an intrinsic viscosity IV of the film comprises a range of 0.5-0.85 in dl/g;
(iv) a small endothermic peak temperature, Tmeta measured on the film comprises a range of 180–230° C.;
(v) at least one light stabilizer is added, in at least one of the outer layers, in a total concentration comprising a range of 0.1-35 in % w/w;
(vi) at least one of the outer layers contains $TiO_2$ particles in a concentration comprising a range of 0.01% w/w to <4% w/w.

2. The film according to claim 1, wherein a global planar SST modulus of the film (GPSM) comprises a range of 440-465 in kgf/mm$^2$.

3. The film according to claim 1, wherein no chalking phenomenon represented by a powdering on the surface of the film, is observed before or after natural accelerated ageing.

4. The film according to claim 1, having a total thickness comprised within the a range of 10-500 in μm.

5. The film according to claim 1, wherein the film comprises a flame retardant.

6. The film according to claim 1, wherein the film comprises a radical scavenger.

7. A method for manufacturing a multilayer biaxially oriented white polyester film for controlling the hydrolysis resistance of said polyester film according to claim 1, said method consisting of comprising:
   a. Synthesizing or implementing one or several different polyesters;
   b. Adding $TiO_2$ and at least one light stabilizer in polyester(s);
   c. Optionally pre-drying the polyester(s);
   d. Heating the polyester(s) to melt it and make it malleable;
   e. Extruding the melted polyester(s) and processing into a multilayered film;
   f. Quenching and solidifying the multilayered film;
   g. Subjecting the multilayered film to biaxial stretching in the longitudinal and transverse directions at a given stretching temperature Ts;
   h. Heating the stretched film at a given heating temperature Th;
wherein Ts, Th, or both Ts and Th are selected so that the endothermic peak temperature, Tmeta, be maintained below 240° C., in order to control the hydrolysis resistance of said polyester film.

8. The method according to claim 7, wherein in step b, $TiO_2$ is added via PET-based master batches; $TiO_2$ particles being preferably introduced from a white master batch WMB2 containing at least 40% of $TiO_2$, said white master batch WMB2 being obtained by performing solid phase polymerization under vacuum and high temperature using a white master batch starting raw material WBM1.

9. A laminate comprising the film according to claim 1 and at least one adjacent film.

10. The laminate according to claim 9 wherein a peel strength at an interface between the film of claim 1 and said at least one adjacent film is greater than or equal to 5N.

11. A solar or photovoltaic cell or battery having a back sheet comprising the film according to claim 1.

12. The solar or photovoltaic cell or battery according to claim 11, wherein said back sheet is made by the process of claim 7.

13. A method for avoiding chalking or powdering phenomenon after ageing in a multilayer biaxially oriented white polyester film comprising at least three polyester layers, respectively a core layer and two outer layers that is the same or different, and containing $TiO_2$ particles, wherein:
   (i) at least one layer includes a PolyEthyleneTerephthalate (PET) whose:
      a. number average molecular weight comprises a range of 18500-40000;
      b. intrinsic viscosity IV is included within a range of ≥0.70 in dL/g;
      c. carboxyl group content comprises a range of ≤30 in eq/T;
   (ii) the core layer includes $TiO_2$ particles at a concentration comprising a range of 0.1-40 in % w/w;
   (iii) an intrinsic viscosity IV of the film comprises a range of 0.5-0.85 in dl/g;
   (iv) a small endothermic peak temperature, Tmeta measured on the film comprises a range of 180–230° C.;
   (v) at least one light stabilizer is added, in at least one of the outer layers, in a total concentration comprising a range of 0.1-35 in % w/w;
   (vi) at least one of the outer layers contains $TiO_2$ particles in a concentration comprising a range of 0.01% w/w to <4% w/w.

* * * * *

UNITED STATES PATENT AND TRADEMARK OFFICE
CERTIFICATE OF CORRECTION

PATENT NO.         : 9,608,153 B2
APPLICATION NO.    : 13/942198
DATED              : March 28, 2017
INVENTOR(S)        : Lacrampe Page 1 of 1

It is certified that error appears in the above-identified patent and that said Letters Patent is hereby corrected as shown below:

In the Claims

Column 19, Line 14, Claim 7:
Change: "method consisting of comprising:"
To: --method comprising:--

Column 19, Line 36, Claim 8:
Change: "being preferably introduced from a white master batch"
To: --being introduced from a white master batch--

Signed and Sealed this
Thirtieth Day of May, 2017

Michelle K. Lee
*Director of the United States Patent and Trademark Office*